United States Patent
Eymery et al.

(10) Patent No.: US 8,193,525 B2
(45) Date of Patent: Jun. 5, 2012

(54) METHOD FOR PRODUCING PLANAR TRANSPORTING RESONANCE HETEROSTRUCTURES

(75) Inventors: Joël Eymery, Sassenage (FR); Pascal Gentile, Voiron (FR)

(73) Assignee: Commissariat a l'Energie Atomique, Paris (FR)

( * ) Notice: Subject to any disclaimer, the term of this patent is extended or adjusted under 35 U.S.C. 154(b) by 680 days.

(21) Appl. No.: 11/576,605

(22) PCT Filed: Oct. 12, 2005

(86) PCT No.: PCT/FR2005/050845
§ 371 (c)(1),
(2), (4) Date: Jan. 29, 2008

(87) PCT Pub. No.: WO2006/040500
PCT Pub. Date: Apr. 20, 2006

(65) Prior Publication Data
US 2008/0246022 A1   Oct. 9, 2008

(30) Foreign Application Priority Data
Oct. 12, 2004 (FR) ...................................... 04 10761

(51) Int. Cl.
*H01L 29/06* (2006.01)
(52) U.S. Cl. ........ 257/25; 257/30; 257/31; 257/E21.211; 257/E29.005
(58) Field of Classification Search ............... 257/25, 257/18, 15, E21.211, E29.005, 30, 31; 438/406
See application file for complete search history.

(56) References Cited

U.S. PATENT DOCUMENTS

| | | | |
|---|---|---|---|
| 4,503,447 A | | 3/1985 | Iafrate et al. |
| 4,799,091 A | | 1/1989 | Reed |
| 5,294,807 A | * | 3/1994 | Ugajin et al. ................... 257/14 |
| 5,449,561 A | * | 9/1995 | Golding et al. ............... 428/457 |
| 5,593,908 A | | 1/1997 | Jovanovic et al. |
| 5,629,231 A | | 5/1997 | Kiehl |
| 5,705,321 A | * | 1/1998 | Brueck et al. ................. 430/316 |
| 5,714,765 A | * | 2/1998 | Noetzel et al. .................. 257/17 |
| 5,888,885 A | * | 3/1999 | Xie ............................... 438/493 |
| 6,020,605 A | * | 2/2000 | Ugajin ......................... 257/191 |
| 6,261,928 B1 | * | 7/2001 | Bruel ............................ 438/459 |
| 6,265,329 B1 | * | 7/2001 | Shiralagi et al. ................ 438/22 |
| 6,329,668 B1 | * | 12/2001 | Razeghi .......................... 257/14 |
| 7,041,227 B2 | | 5/2006 | Fournel et al. |
| 7,229,897 B2 | | 6/2007 | Fournel et al. |
| 2003/0186512 A1 | | 10/2003 | Semeria et al. |
| 2004/0031975 A1 | | 2/2004 | Kern et al. |
| 2004/0056243 A1 | * | 3/2004 | Atanackovic et al. .......... 257/19 |

(Continued)

FOREIGN PATENT DOCUMENTS

EP   0 427 905 A2   5/1991

(Continued)

OTHER PUBLICATIONS

R. Jaszek, "Carrier Scattering by Dislocations in Semiconductors", Journal of Materials Science:Materials in Electronics, vol. 12, 2001, pp. 1-9.

*Primary Examiner* — Thinh T Nguyen
(74) *Attorney, Agent, or Firm* — Oblon, Spivak, McClelland, Maier & Neustadt, L.L.P.

(57) ABSTRACT

An electron transport device, including at least one transport layer in which at least one periodic dislocation and/or defect array is produced, and a mechanism for guiding electrons in the transport layer.

20 Claims, 5 Drawing Sheets

U.S. PATENT DOCUMENTS

2004/0074866 A1   4/2004   Fournel et al.

FOREIGN PATENT DOCUMENTS

| | | |
|---|---|---|
| EP | 0 651 447 A1 | 5/1995 |
| EP | 0 703 626 A2 | 3/1996 |
| EP | 0 750 353 A2 | 12/1996 |
| FR | 2 815 121 | 4/2002 |
| WO | WO 99 05711 | 2/1999 |
| WO | WO 02/054466 | 7/2002 |
| WO | WO 2004/021410 A2 | 3/2004 |

* cited by examiner

METHOD FOR PRODUCING PLANAR TRANSPORTING RESONANCE HETEROSTRUCTURES

TECHNICAL FIELD AND PRIOR ART

Resonant electron transport structures very often use geometries obtained by alternations of layers with different physical properties.

These layers are obtained, for example, by growths or successive treatments or transfers of layers along the normal to the sample, both for two-dimensional structures and along one-dimensional wire-type structures.

The same applies to the entire family of tunnel diodes, which use transitions between electronic bands or resonances between tunnel barriers.

In the field of semiconductors such structures implement materials that differ from one another by their forbidden band.

However, these techniques also lead to the creation of interfaces, as well as uncontrolled structural imperfections or heterogeneities due to defects caused by the lithography and etching techniques used to produce such components. These defects can lead to interface or volume states that are detrimental to conduction properties.

One therefore face the problem of finding an electron conduction or transport structure without these problems.

One also face the problem of finding devices making it possible to characterise an electric and/or magnetic field.

DESCRIPTION OF THE INVENTION

According to the invention, micro or nanodefects ordered in a crystal are used to produce resonant electron transport devices in a planar or longitudinal shape.

The invention relates to an electron transport device, comprising
- at least one transport layer in which at least one periodic dislocation or defect array is produced,
- means for guiding electrons in a plane of said transport layer.

Such a device has one or more resonances during the transfer of electrons in the transport layer.

In the case of a dislocation array, at least some of the dislocations can be decorated by electrical charges and/or chemical species.

A dislocation array can be arranged in a square or in a rectangle, or in a hexagon, or, more generally, according to the symmetry imposed by the interactions between said dislocations.

The defect array can also at least partially be of the irradiation and/or implantation defect type.

Means for electrical contact with the transport layer can be provided.

According to one embodiments the guide means comprise an insulating layer, or a relatively non-conductive layer, on which the transport layer is placed.

Means can also be provided for applying and/or measuring and electric and/or magnetic field in the transport layer.

The transport layer can have the form of at least one area extended in a first direction, in which the periodic array has a first period.

It can also comprise at least one second area extended in a second direction, advantageously different from the first direction, in which the periodic array has a second period, which may or may not be different from the first.

Then, different resonances are obtained in the different electron propagation directions defined by the directions of the extended areas.

A second transport layer can be produced. The second transport layer can also have a dislocation and/or defect array.

It is possible to produce two or more superimposed layers, with an array in each layer, of which the dislocations and/or the defects may or may not be offset, the shapes of the arrays being capable of being identical or different. Such a stack makes it possible to increase the effective area of interaction between the electrons and the defects.

Each transport layer can have a thickness of between 1 nm and 1 µm.

Advantageously, the transport array is produced in the superficial layer of a SOI structure, or a semiconductor-on-insulator structure, the insulating layer being capable of being used as a guide layer.

The invention also relates to a diode with negative differential resistance, comprising a device according to the invention, as described above.

The invention also relates to a method for producing micro or nanostructures by a technique that allows for good control of the distances and the modification of a crystalline material called a "matrix", having few intrinsic defects.

It can be constituted by a plurality of layers.

The invention also relates to a method for producing an electron transport device, comprising:
- the formation of at least one periodic dislocation and/or defect array in a layer, called a transport layer,
- the formation of means for guiding electrons in the plane of said transport layer.
- The array can be of the type comprising at least one dislocation array, the method also comprising a step of decorating at least some of the dislocations with electrical charges and/or chemical species.

The array can be obtained from a step of bonding two crystalline materials and/or implantation and/or irradiation.

A step of forming means for electrical contact with the layer can also be performed.

The step of forming guide means preferably comprises a step of forming an insulating or relatively non-conductive layer on which the transport layer is placed.

BRIEF DESCRIPTION OF THE FIGURES

FIGS. 1A to 3 show various aspects of a device according to the invention;

DETAILED DESCRIPTION OF EMBODIMENTS OF THE INVENTION

Figure 1A:
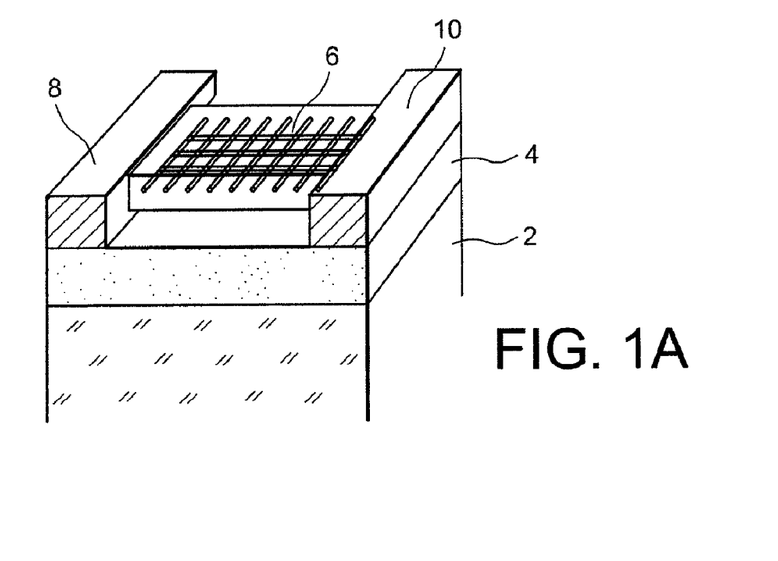

A first embodiment of the invention is shown in FIG. 1A.

In a first layer 6, a periodic dislocation and/or defect array is produced, through which the electron transport takes place, with the periodicity of the array conferring a resonant character on said transport.

The array can be periodic in one or two dimensions.

This array is, for example, produced as explained in document WO 99/05711 or in document WO 02/054466.

Thus, the array can be produced by bonding by contacting a surface of a first crystalline material plate with a surface of a second crystalline material plate, so that the crystalline arrays presented by said surfaces have at least one different parameter capable of enabling the formation of a crystalline defect array and/or a constraint array in a crystalline areas extending on each side of the interface of the two plates, with at least one of the arrays defining the micro or nanostructure.

The difference parameter can be constituted by a predetermined rotational offset angle of the crystalline arrays presented by the two surfaces, and/or by a crystal lattice parameter difference between the crystalline materials of the surfaces of the plates in contact and/or by a predetermined angle according to which the surface of at least one of the plates is offset with respect to the simple crystallographic plane in the direction corresponding to said surface.

The contact of the surfaces can be of the hydrophobic or hydrophilic type.

A thermal treatment step can make it possible to complement the formation of the defect and/or constraint array and to reinforce the interatomic bonds between the surfaces of the plates in contact.

It is thus possible to obtain an array of steps between, for example, several nanometres and several dozen or hundred nanometres or several micrometers for example between 1 nm and 60 nm or 100 nm or 500 nm or 1 μm or 20 μm.

Other details relating to the production of this type of array can be found in the two documents referenced above.

To produce micro or nanostructures, it is therefore possible to use molecular bonding in order to obtain dislocation arrays that can optionally be decorated with other chemical species or cavities.

The bonding of materials that are identical or different (in terms of chemical nature and/or crystallographic orientation) can be used to define the nature and the step of the dislocations. The use of bonding multilayers is possible to increase the effective area of interaction of the electrons with the defects.

For example, it is possible to superimpose two layers, one with a thickness of around 10 nm and the other with a thickness of 20 nm or 100 nm, on a $SiO_2$ layer.

The more defects there are, the greater the probability there is for the electrons to encounter said defects, and for their transport to thus be modified.

Figure 4A:
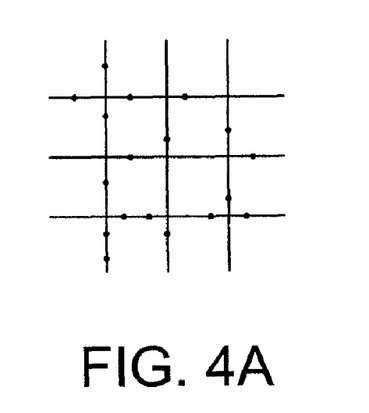
FIGS. 4A to 4B show dislocation arrays.
Figure 4B:
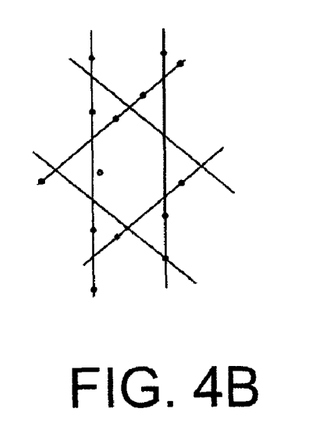

For example, a Si(001)/Si(001) bond will give a square array (as shown in FIG. 4a) of dislocations while a Si(111)/Si(011) bond will give a hexagonal array (as shown in FIG. 4B). If the materials are of different types, the array will be rather rectangular.

As an alternative, or in combination with the previous technique, it is also possible to use irradiation and/or implantation methods, i.e. exposure to radiation (electrons and/or ions), which create defects (gaps and/or interstitial defects) in the material 6 in which the transport takes place, either directly if the size of the probe is small enough, or through a mask.

The defects created can be passive and/or active with respect to the transport phenomenon.

For example, for dislocations, it is possible to have a phenomenon of diffusion or diffraction of the charge carriers on these linear defects, but it is also possible to provide additional charges (electrons or holes) that can contribute directly to the transport.

The electron donor or acceptor character is defined by the nature of the defect, optionally by its decoration with elements and/or particles added voluntarily or captured spontaneously.

In any embodiment, the electrons are confined in a planar layer, limited in thickness around the array so as to promote the interactions between said two entities.

The transport is therefore guided so that the interaction conditions are forced in the plane of the layer 6 containing the defects.

According to the embodiment of FIG. 1A, the matrix with its micro or nanostructures is thus separated from the substrate by a barrier layer 4, which is insulating or relatively non-conductive with respect to the conductivity of the layer 6 so that most of the current circulates in this layer 6.

A SOI-type component, comprising a substrate, a thin insulating layer (for example SiO2 oxide) and a thin semiconductor layer, in particular silicon, is suitable for producing a device according to the invention.

It is also possible, when the array is obtained by bonding, to thin one of the plates in order to limit the thickness of the layer 6. This thinning can involve a step of grinding, mechanical or chemical abrasion, or cleavage. In the last case, one of the surfaces can, for example, have been previously subjected to ion implantation in order to form a cleavage plane.

The transport layer 6 has a thickness between, for example, several nm and 100 nm or several hundred nm, for example between 1 nm or 5 nm and 100 or 200 nm or 500 nm or 1 μm.

Figure 1B:
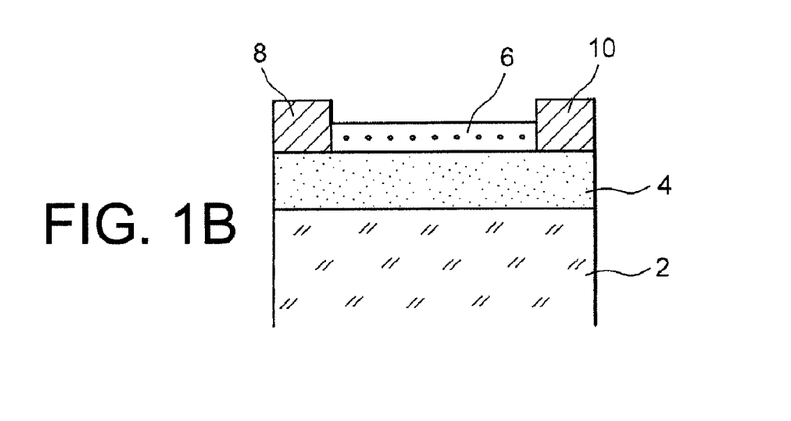

As shown in FIG. 1B, which is a side view of the device of FIG. 1A, contacts 8, 10 can be produced on the active layer 6, for example by metal deposits, in order to ensure the lateral conduction of the charges in the layer 6.

Figure 2:
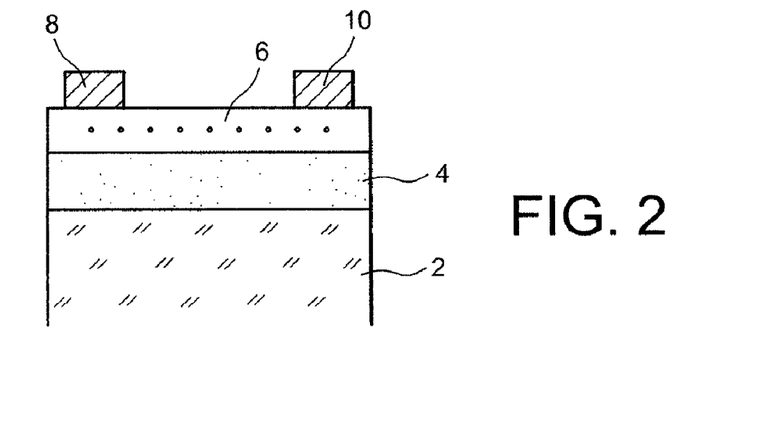

According to an alternative the pads 8, 10 can be provided on the layer 6 (FIG. 2) and no longer on each side as in FIG. 1B.

According to another alternative (FIG. 3), the pads 8, 10 can be provided partially in the layer 6, and partially above the level or the upper surface of the layer.

Figure 3:
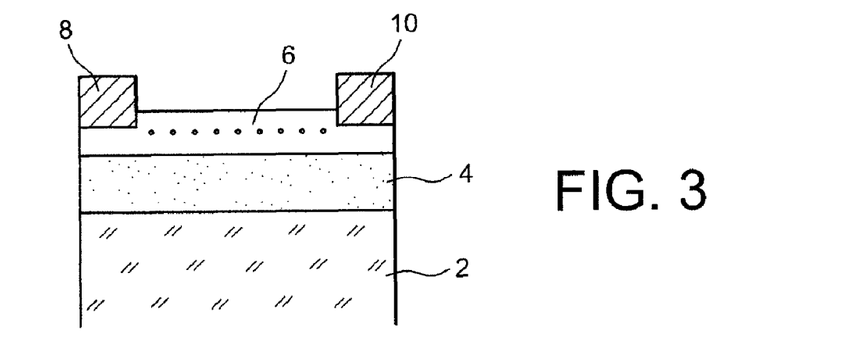

The assembly of the two layers and contacts can rest on a substrate 2.

Lithography and etching of the layer 6 can also be performed and used to define, in the plane of this same layer 6, one or more relative transport directions It is thus possible to define transport bands, possibly with different orientations, from the plane of the layer 6.

Figure 7A:
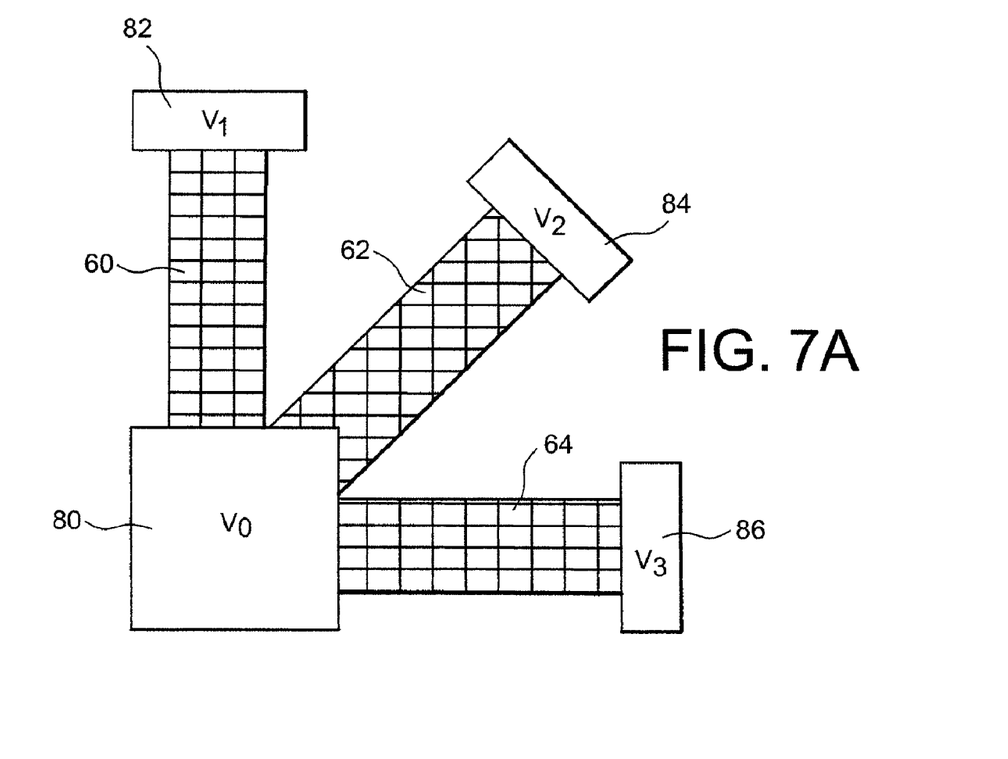
FIGS. 7A, 7B, 8A, 8B, 9A and 9B show other examples of applications of devices according to the invention.
Figure 7B:
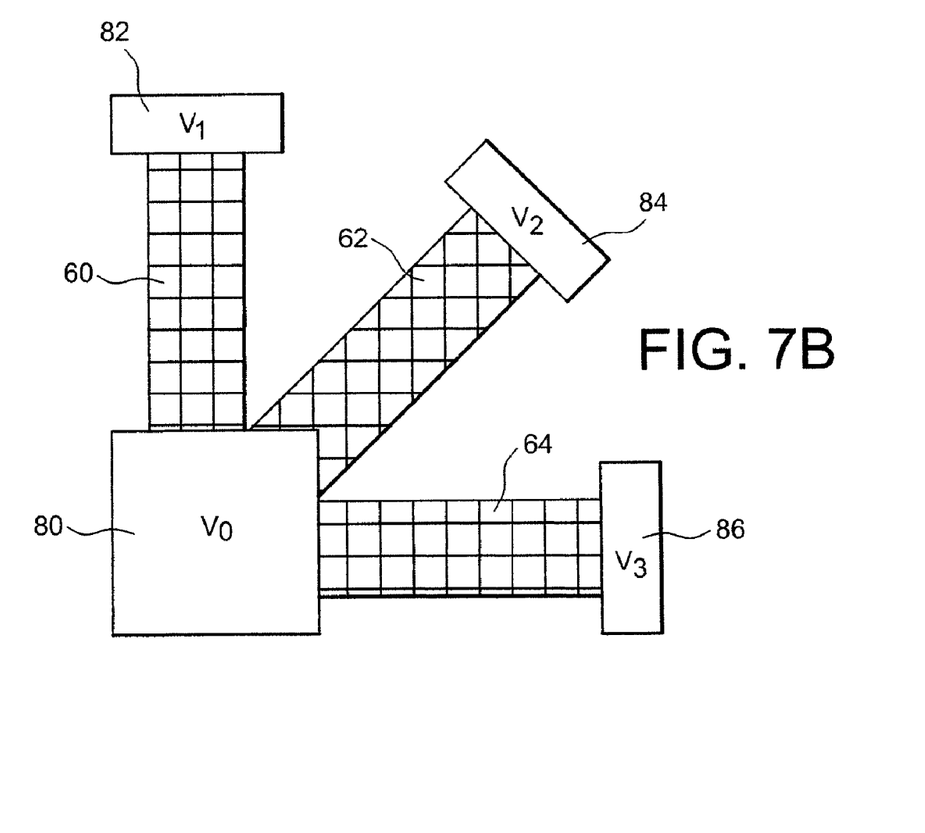

Thus, it is possible to define axes 60, 62' 64 of movement of the charges, as shown in FIGS. 7A and 7B, which will be described below.

This effect can be used to modulate the resonance effects, in the sense that the carriers can travel over different lengths before interacting with a defect if bands are traced with different orientations with respect to the pattern of the array, as explained below in relation to FIGS. 4A and 4P.

A confinement layer 4 can be used in combination with the definition of transport bands in the plane of the layer 6 containing the array.

The dislocation and/or defect array can be square, as shown in FIG. 4A, or hexagonal, as shown in FIG. 4B. These shapes are only examples, and the defects and/or dislocations can be arranged in other geometric shapes, in particular rectangles.

FIGS. 4A and 4B also show decorations of dislocation lines produced by electrical charges and/or chemical species 12, 14, 16, 18.

As shown in FIG. 4A, the step or the period of a single array in two different directions D1 and D2 is not the same.

If the charges essentially move in direction D1, they will therefore not have the same step or the same period as if they move in direction D2. The variation of the step of the pattern according to the direction of propagation could also be observed in any other type of array, for example in the case of the structure of FIG. 4B.

Figure 5A:
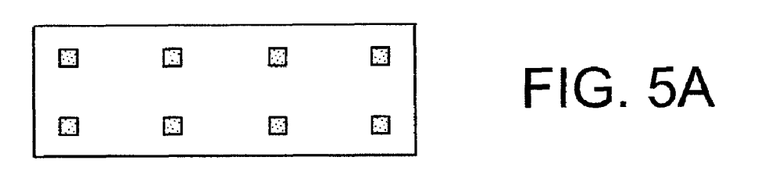
FIGS. 5A to 5C show irradiation defect arrays.
Figure 5B:
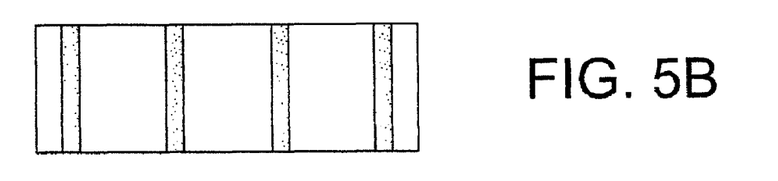
Figure 5C:
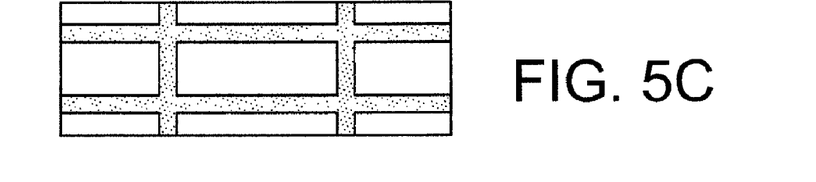

FIGS. 5A to 5C show defect arrays produced by irradiation and/or Implantation, with a form of pads (FIG. 5A) or bands mutually parallel (FIG. 5) or intersecting (FIG. 5C). In this latter case, the bands shown are crossed orthogonally, but this is not always the case. Again, the step of the electrons, and therefore the characteristics of resonance due to the periodic character of the defects, is dependent on the direction of propagation of the electrons.

Regardless of the embodiment envisaged the layer 6 can be used in combination with gates 20, 22 for applying an electric field (FIG. 6), which makes it possible to modulate the transport properties of the charges moving in the layer 6. These gates are preferably as close as possible to the band.

FIGS. 7A and 7B show the case of a layer 6 in which a defect and/or dislocation array has been produced as explained above.

In addition, three bands 60, 62, 64 have been etched in the layer 6.

Each of these bands defines a main direction of propagation of charges, between a pad 80 and one of the three pads 82, 84, 86.

FIG. 7A can show, for example, a case of a dislocation array formed by molecular bonding of two crystalline semiconductor materials of different types.

FIG. 7B can show, for example, another case of a dislocation array formed by molecular bonding of two identical crystalline semiconductor materials, for example a Si(001)/Si(001) bond.

Due to the different directions of these bands, a specific step or period is associated with each direction, therefore with each band 60, 62, 64 as explained above in relation to FIG. 4A. Thus, the step or the period of the band 60 is different from the step or the period seen in the band 62, which is different from the step or the period seen in the band 64.

The last one can be equal to the step of the band 60.

More generally, it is possible to produce a structure comprising at least two bands having different direction, two of the bands having two identical steps.

In two bands with different directions, but identical steps, the transport of the charges is the same when no field is applied. By contrast, in the presence of a magnetic and/or electric field, the transport is no longer identical in the two bands. By a simple difference, for example between the currents in the two branches, it is possible to detect the presence of a field.

In the case of FIGS. 7A and 7E, three current or voltage measurements can therefore be performed, one for each of the three bands, with different resonances from one another due to the difference in step or period of the charge carriers in each of the bands.

The example of three bands was given, but it can also be any number n of bands (2 or 4 or n>4).

If the device is subjected to an electric or magnetic field, for example exterior, to be measured, the modulation of the currents in the three, or n bands, provides information on the directions and intensities of these fields. The field(s) can be in any direction with respect to the plane of the bands, in this case the plane of the figure.

However, the band gives access only to the component of the field projected onto said band. By contrast, if the field is in the plane of the bands, two bands are enough to fully define it.

Figure 6:
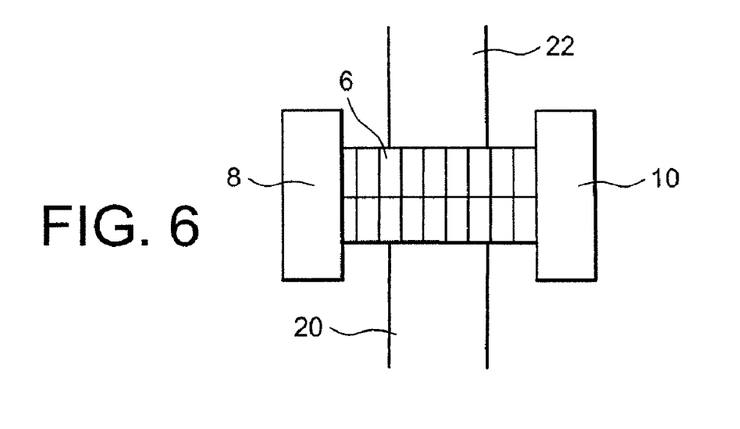
FIG. 6 shows an application of a device according to the invention.

Advantageously, if an external field $\vec{B}$ is to be measured, it is possible to provide gates (similar to the gates 20, 22 defined above); to measure the field $\vec{E}$ created in the transport band, the field $\vec{B}$ indeed modifies the distribution of charges inside this band.

More generally, it is possible, according to the invention, to use a change in direction of the pattern etched with respect to the array in order to show a plurality of resonances according to the desired application.

Figure 8A:
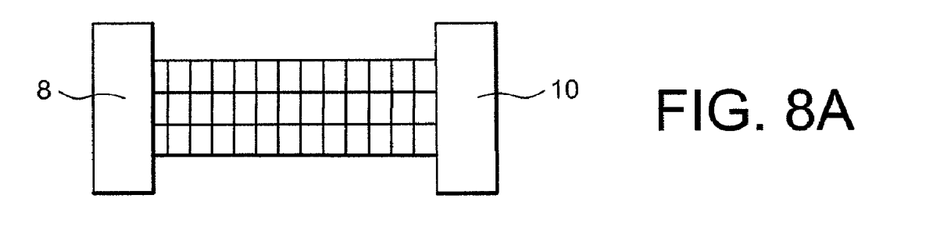
Figure 8B:
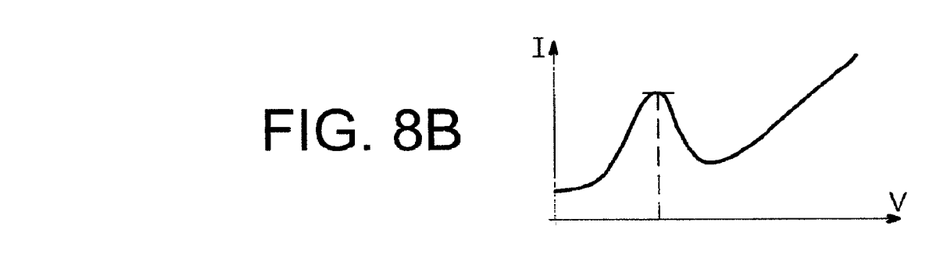
Figure 9A:
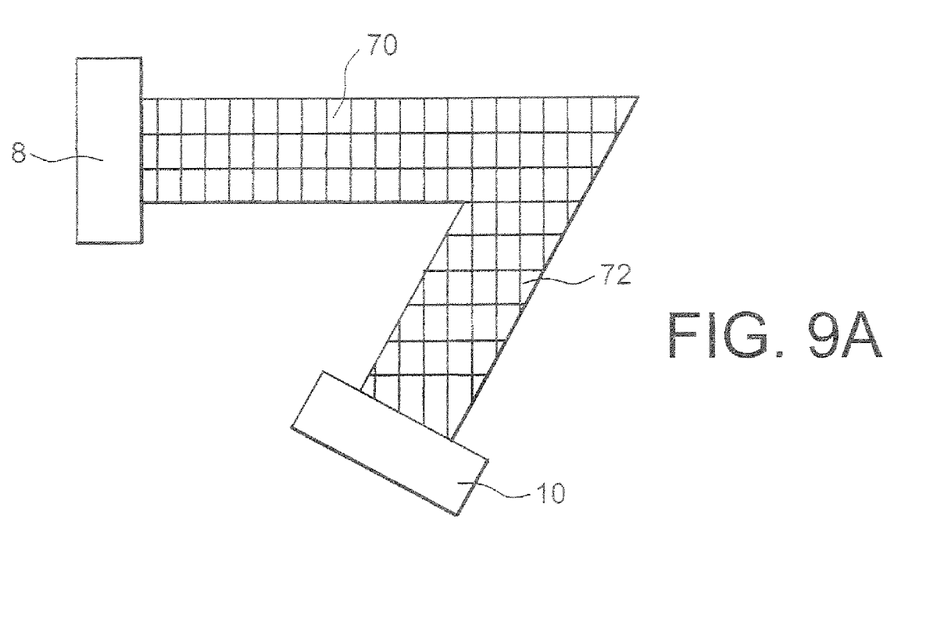
Figure 9B:
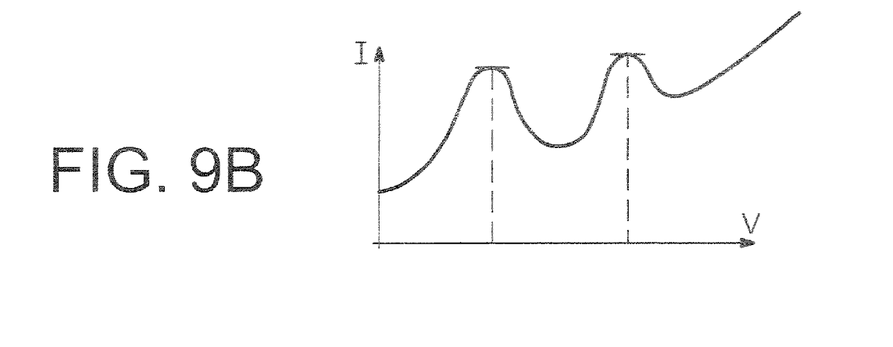

For example, for the structures of FIGS. 8A and 9A, we will have voltage-current curves with the form shown respectively in FIGS. 8B and 9B.

In the case of FIG. 8A, the period of the array and the guide of the charges (electrons) result in the appearance of a resonance that involves a peak in the current (I)—voltage (V) curve. The current and the voltage are measured between the pads 8, 10.

In the case of FIG. 9A, the electrons will be propagated in two different successive directions, and therefore successively have, as explained above, different array periods. This results in the appearance of two resonance peaks in the curve I-V (FIG. 9B). Again, the current and the voltage are measured between the pads 8, 10.

A plurality of peaks can be superimposed on a curve I/V from the same dislocation array, by setting a variable direction of the transport path, or successive transport segments with a variable direction. It is also possible to obtain a step variation in an array by irradiation, using masks to locate the irradiated areas.

The diffusion and/or diffraction on the periodic defects of the array created can also be used to produce diode-type structures with negative differential resistances. It is possible for the curve I(v) of the device of the invention to be that of a diode. It is therefore the device itself that constitutes the diode. The peak-to-valley ratio of a characteristic I/V of such a diode can then be adjusted owing to the period and the number of periods of defects of the electrons.

Again, in this application, a plurality of peaks can also be superimposed on a curve I/V, from the same dislocation array, by setting the direction of the transport path, or by modifying the step of the masks with an irradiation technique.

Regardless of the embodiment of the invention, the application of a magnetic or electric field, either locally in the vicinity of the micro or nanostructure, or on the entire structure, can modify the electrical transport conditions in these materials. The direction of the field can be any, as already explained above. It can be intentional, set for example by the voltages applied at the terminals 8, 10, or come from the external environment (this is the case, for example, for an application with a sensor).

In this case, we advantageously use the regularity of the array and guiding in the area containing dislocations the carriers thus have different mobilities according to the directions since their probability of encountering the arrays is different according to the direction.

This dependence can be used to produce a magnetic field sensor sensitive to the direction of the field: indeed, the variation in the current or the voltage in the plane of the array or in a guide band, is related to the direction and the intensity of the applied field E and/or H.

Means can be provided in order to measure a variation of a reference current circulating in the layer, or in one or more guide bands, when applying an electric and/or magnetic field. Alternatively, it is possible to provide means for measuring the voltage generated in said layer.

The invention is easy to carry out because it requires few technological steps molecular bonding or the use of a technique of irradiation and/or implantation through the mask with ions. It does not use elaborate deposition techniques (trench filling, complex patterns, etc.).

Finally, large surfaces can easily be produced using the invention (VLSI object).

An example of an embodiment involves a device that uses the diffusion or diffraction of electrons by a dislocation array of a thin layer 6 obtained by molecular bonding this layer being separated from the support 2 by an oxide layer 4 (SiO$_2$).

The bonded layer is produced from a SOI substrate (001) according to the technique described in document WO 02 054466.

A regular and coherent square dislocation array is produced over large distances (for example with a step of 22 nm). The array of identical dislocations has a controlled step (generally several nm to several microns). It is possible to thin the bonded layer 6, for example to 10 nm.

Then, the lithography of bands is performed, parallel to one of the sides of the square formed by the dislocation lines.

The width of the lithographically-produced lines will correspond to some sides of the square (for example 50 nm, which corresponds to around 2 periods), while the length will be larger (for example 1m, i.e. 50 periods).

Various orientation of the lithographically-produced pattern with respect to the dislocation array can be used to modulate the anticipated resonance effects.

The application of a magnetic and electric field in a well-defined direction will also make it possible to modulate the electronic transport properties.

According to an alternative to this example, the defect areas result in localised electron irradiation (<50 keV) or localised ion implantation (<2 MeV) in a SOI structure. The localisation of the irradiation or the implantation can be done by means of masks.

The sizes and spacing of the patterns will then be greater, given the technological constraints of the mask production for example a mask of square patterns with sides of around 22 nm). Each mask pattern defines an area of irradiation or implantation defects, with the density of the defects in each area being set by the conditions (dose, energy, elements chosen, etc.) of implantation by irradiation.

Structures obtained by these techniques are shown in FIGS. 5A to 5C.

According to the invention it is also possible to produce two or more superimposed layers, with an array in each layer, of which the dislocations and/or defects may or may not be offset, and the shapes of the arrays can be identical or different. Such a stack makes it possible to increase the effective area of interaction between the electrons and the defects. The production of such a stack can be obtained by successive bonding operations. Or, a first array is obtained by bonding and a second is obtained by irradiation.

The invention claimed is:

1. An electron transport device, comprising:
   at least one transport layer in which at least one periodic dislocation and/or defect array is produced,
   wherein said transport layer includes at least one area extended in a first electron travel direction, in which the periodic array has a first period, and at least one second area extended in a second electron travel direction, different from said first electron travel direction, in which the periodic array has a second period, with the second period being different from said first period;
   a first guiding device that guides electrons in a plane of said transport layer and in said first electron travel direction, said first guiding device including a first pair of pads in contact with said transport layer and means for applying voltages to said first pair of pads; and
   a second guiding device that guides electrons in a plane of said transport layer and in said second electron travel direction, said second guiding device including a second pair of pads in contact with said transport layer and means for applying voltages to said second pair of pads.

2. A diode with negative differential resistance, comprising a device according to claim 1.

3. A device for characterizing an electric and/or magnetic field, comprising a device according to claim 1 and means for detecting a variation in intensity of a current circulating in said transport layer or a voltage generated in said transport layer.

4. A device according to claim 1, comprising at least one dislocation array, wherein at least some of dislocations are decorated by electrical charges and/or chemical species.

5. A device according to claim 1, comprising at least one array of dislocations arranged in a square, in a rectangle or in a hexagon.

6. A device according to claim 1, comprising at least one array of irradiation and/or implantation defects.

7. A device according to claim 1, wherein the first guiding device and the second guiding device comprise an insulating layer on which said transport layer is placed.

8. A device according to claim 1, further comprising means for applying and/or measuring an electrical and/or magnetic field in said transport layer.

9. A device according to claim 1, further comprising at least one second transport layer with a dislocation and/or defect array.

10. A device according to claim 1, wherein the transport layer is produced in the superficial layer of a SOI structure.

11. A method for producing an electron transport device, comprising:
    forming at least one periodic dislocation and/or defect array in a transport layer, including bonding two crystalline materials;
    forming guide means for guiding electrons in the plane of said transport layer;
    forming at least one area extended in a first electron travel direction, in which the periodic array has a first period, and producing at least one second area extended in a second electron travel direction, different from the first electron travel direction, in which the periodic array has a second period, wherein the second period is different from the first period; and
    forming electrical contacts on the transport layer, said electrical contacts being arranged to define the first electron travel direction and the second electron travel direction.

12. A method according to claim 11, wherein the extended areas are produced by etching the transport layer.

13. A method according to claim 11, further comprising forming at least one second transport layer, with a dislocation and/or defect array.

14. A method according to claim 11, wherein the transport layer is produced in a superficial layer of a SOI structure.

15. A method according to claim 11, wherein the array comprises at least one dislocation array, the method further comprising decorating at least some of dislocations with electrical charges and/or chemical species.

16. A method according to claim 11, wherein the forming the array comprises irradiation and/or implantation.

17. A method according to claim 11, further comprising forming means for electrical contact with said transport layer.

18. A method according to claim 11, wherein the forming the guide means comprises forming an insulating layer or a relatively non-conductive layer on which said transport layer is placed.

19. A method according to claim 11, wherein the forming the guide means comprises a thinning.

20. An electron transport device, comprising:
- at least one transport layer in which at least one periodic dislocation and/or defect array is produced;
- an insulating layer that guides electrons in a plane of said transport layer,
- wherein said transport layer includes at least one area extended in a first electron travel direction, in which the periodic array has a first period, and at least one second area extended in a second electron travel direction, different from said first electron travel direction, in which the periodic array has a second period, with the second period being different from said first period; and
- electrical contacts disposed on the transport layer, wherein the electrical contacts are arranged to define the first electron travel direction and the second electron travel direction.

* * * * *